(12) United States Patent
Lerner

(10) Patent No.: US 8,823,095 B2
(45) Date of Patent: Sep. 2, 2014

(54) MOS-POWER TRANSISTORS WITH EDGE TERMINATION WITH SMALL AREA REQUIREMENT

(75) Inventor: Ralf Lerner, Erfurt (DE)

(73) Assignee: X-Fab Semiconductor Foundries AG, Erfurt (DE)

( * ) Notice: Subject to any disclaimer, the term of this patent is extended or adjusted under 35 U.S.C. 154(b) by 196 days.

(21) Appl. No.: 12/304,789

(22) PCT Filed: Jun. 14, 2007

(86) PCT No.: PCT/EP2007/055924
§ 371 (c)(1),
(2), (4) Date: Jun. 2, 2009

(87) PCT Pub. No.: WO2007/144416
PCT Pub. Date: Dec. 21, 2007

(65) Prior Publication Data
US 2010/0295124 A1    Nov. 25, 2010

(30) Foreign Application Priority Data
Jun. 14, 2006  (DE) .......................... 10 2006 027 504

(51) Int. Cl.
*H01L 29/66* (2006.01)
*H01L 29/78* (2006.01)
*H01L 29/06* (2006.01)

(52) U.S. Cl.
CPC ........ *H01L 29/7824* (2013.01); *H01L 29/7823* (2013.01); *H01L 29/0692* (2013.01); *H01L 29/0661* (2013.01); *H01L 29/7835* (2013.01)
USPC ........... 257/337; 257/287; 257/341; 257/346; 257/347; 257/401; 257/E29.256; 257/E29.262

(58) Field of Classification Search
USPC ......... 257/287, 337, 341, 346, 347, 374, 401, 257/500, E29.256, E29.262
See application file for complete search history.

(56) References Cited

U.S. PATENT DOCUMENTS 5,763,914 A    6/1998   Hshieh et al.
5,844,277 A    12/1998  Hshieh et al.
(Continued)

FOREIGN PATENT DOCUMENTS

DE   103 43 132      4/2005
EP   0649175 A1      4/1995
(Continued)

OTHER PUBLICATIONS

International Search Report for PCT/EP2007/055924 mailed Oct. 22, 2007, 2 pages.

*Primary Examiner* — Andy Huynh
(74) *Attorney, Agent, or Firm* — Hunton & Williams LLP

(57) ABSTRACT

It is the purpose of the invention to provide a MOS transistor (20) which guarantees a voltage as high as possible, has a required area as small as possible and which enables the integration into integrated smart power circuits. It results there from as an object of the invention to form the edge structure of the transistors such that it certainly fulfils the requirements on high breakthrough voltages, a good isolation to the surrounding region and requires a minimum of surface on the silicon disc anyway. This is achieved with an elongated MOS power transistor having drain (30) and source (28) for high rated voltages above 100V, wherein the transistor comprises an isolating trench (22) in the edge area for preventing an early electrical breakthrough below the rated voltage. The trench is lined with an isolating material (70, 72), wherein the isolating trench terminates the circuit component.

6 Claims, 4 Drawing Sheets

(56) References Cited

U.S. PATENT DOCUMENTS

| | | |
|---|---|---|
| 6,635,944 B2 | 10/2003 | Stoisiek |
| 6,825,510 B2 | 11/2004 | Probst |
| 6,900,504 B2 | 5/2005 | Leonardi |
| 6,900,523 B2 | 5/2005 | Qu |
| 6,921,699 B2 | 7/2005 | Ma et al. |
| 6,940,145 B2 | 9/2005 | Blair et al. |
| 7,247,887 B2 * | 7/2007 | King et al. .................. 257/139 |
| 2001/0038125 A1 | 11/2001 | Ohyanagi |
| 2005/0118753 A1 * | 6/2005 | Efland et al. ............... 438/197 |

FOREIGN PATENT DOCUMENTS

| | | |
|---|---|---|
| EP | 0657940 A2 | 6/1995 |
| EP | 0 735 589 | 10/1996 |
| EP | 1 083 607 | 3/2001 |

* cited by examiner

Section A-A:

Section B-B:

Section A-A

Section B-B

MOS-POWER TRANSISTORS WITH EDGE TERMINATION WITH SMALL AREA REQUIREMENT

CROSS-REFERENCE TO RELATED APPLICATIONS

This application is a U.S. National Stage Application of International Application No. PCT/EP2007/055924, filed Jun. 14, 2007, which claims the benefit of German Patent Application No. DE 10 2006 027 504.7, filed on Jun. 14, 2006, the disclosure of which is herein incorporated by reference in its entirety.

The invention relates to an edge termination structure in a transistor for high voltages above 100V, which edge termination reduces the required floor space for the electric isolation, for example to neighbouring circuit components, and which facilitates the integration of transistors of high voltages into smart-power-circuits.

FIG. 1 serves for explaining the state of the art in more detail. A vertical MOS power transistor 10 which is used in the power electronic section, usually consists of a plurality transistor cells 12 connected in parallel, each with a source contact and a gate, a is connecting contact for the gate electrode 14 and an edge termination structure 16 surrounding the complete transistor as a sum of the transistor cells. The example shown in FIG. 1 is about a discrete vertical transistor in which the drain contact is positioned on the backside. However, there are also lateral transistors with the usual edge termination structures, connections of which source and drain are on the front side. A parallel structure is, for example, described in U.S. Pat. No. 5,844,277, FIGS. 2A to 2D as well as FIGS. 5 to 7. The same structure is to be found in U.S. Pat. No. 5,763,914. The gate electrode 14 serves, in the case of the discrete transistor, for the electrical connection by means of wire bonding or similar methods. For a transistor which is, for example, integrated in so called smart-power-circuits, a single electrode 14 is omitted and is replaced by corresponding metal conductors.

Common to all embodiments is the presence of an edge structure 16 consisting out of a more or less complex combination of correspondingly provided doping regions in silicon and/or conductive plate structures in order to prevent an early electrical breakthrough at the surface of the transistor.

Most of the known edge structures use more or less complex combinations of correspondingly provided doping regions in the silicon and/or the conductive field plate structures. A survey of the usual variations is to be found in M. Netzel, Analysis, Design and Optimization of discrete vertical IGBT-structures, Ilmenau, Technical University Diss., 1999.

Furthermore, there are edge structures in which trenches are used. In U.S. Pat. No. 6,940,145, for example page 2, lines 37ff, an edge structure for a trench gate MOSFET 2 is described which contains, among others, a trench within the edge structure. The edge structure trench, 12 there, is, therein, located within a region having a doping opposite to the substrate material, and extends to a depth below such doping regions (positioned in front of the trench). The edge structure trench is manufactured with the same processing steps as the gate trench. By means of the edge structure trench, a channel stopper is positioned in the silicon which is intended to prevent disturbing leakage currents. Therein, appropriate doping regions are inserted into the trench side walls below the bottom point of the trench as well as also near the surface thereof. Metallic equipotential rings are produced above the edge structure trench.

The edge structure trench itself serves, in this structure, however, not as edge structure in the actual sense but allows the insertion of the doped channel stopper regions within the disc process at the same time with the doping of the source regions of the transistors.

In the U.S. Pat. No. 6,921,699, an edge structure is described in which the edge termination is carried out as a large lowered area, i.e. metal is etched in a large area. Therefore, it is not a trench in the actual sense, see FIGS. 1a and 2a-u among others. Therein, the lowering is effected to a depth within a N-layer far above the underlying N+ layer. The lowered areas are oxidized in a large area, above this first oxide layer, a poly silicon layer is deposited as well as a LTO (Low Temperature Oxide) layer and a so-called source contact layer (presumably metal).

In the U.S. Pat. No. 6,635,944 an edge structure is described for a vertical pn-transition consisting out of substrate and an oppositely doped well, which edge structure consists out of a doping region near to the surface and doped oppositely to the substrate. This doped region near to the surface extends without gap from the well of the active pn-transition and is doped lower than the well. This doped region is intersected by a deep trench. The trench bottom and the trench side walls are doped similarly to the region near to the surface next to the well. Furthermore, the described structure contains field plates out of electrically conductive material which are located above the trench, to the side thereof, and not directly above the trench. The contacts of the actual pn-transition are located for the well on the front side and for the substrate on the back side of the silicon disc.

A possibility to do without additional doping regions in the edge structure, is shown in the U.S. Pat. No. 6,900,523. A vertical transistor structure with source and gate on the front side of an epitaxial N-layer is shown there. In the direction of the drain connection which is located on the back side, there is arranged an N+-substrate region as well as the drain contact. The edge termination consists out of a lateral widely extended region in which the epitaxial N-layer has been etched off in shape of a V. The apex of the V-shaped area, therein, reaches down to N+-area. Because of the angle of slope of the V-trench, this structure has a substantial space requirement.

In the U.S. Pat. No. 6,825,510 an edge structure is described provided in the shape of a shallow and broad depression (where the trench is broader than deep, i.e. it is rather a cavity), which is completely filled with dielectric material, i.e. for example with silicon dioxide and which extends outwardly directly from the doped well of the vertical trench gate transistor structure with source and gate on the front side and the drain on the back side. Furthermore, the structure contains a field plate extending across a part of the trench and a part of the neighbouring well region. This field plate is supposed to bring the field lines in the blocked state into a parallel shape. This structure is completed to the outside by means of an equipotential ring located on the surface. In a second embodiment, several doped rings in the silicon are used instead of the one equipotential ring on the surface.

On the other hand, filled isolation trenches for the electrical isolation of regions with differing voltages comprising several circuit components, are known, for example in the context of SOI-technology. However, this is not concerned with the electrical isolation of single circuit components.

It is common to all the above mentioned edge structures that they contain a more or less deep trench which, however, does not correspond to the isolation trench known from the SOI technology. Besides this trench, these structures use doped regions in the silicon as well as field plate structures above the silicon. For producing such field plates and doped regions additional processing steps are necessary on the one hand, and, on the other hand, such structures require a certain space. Both matters entail additional error possibilities and costs. Out of this reason, an edge structure would be advantageous which can do without these additional doping regions and field plates.

The edge structures described above, can only be used for discrete circuit components. For an integration into smart-power-circuits, i.e. in such circuits in which circuit components at differing electrical potentials are operated, additional isolation measures have to be implemented.

From the EP-A 1 083 607 (Matsushita), a SOI semiconductor device (a semiconductor circuit on a SOI disc) is available for the men skilled in the art, see the FIGS. 1, 2 and 3 there. It has a circumferential isolation trench but a rotationally symmetric arrangement with a source electrode located inside and a drain electrode located outside immediately at the wall of the trench, which elements are connected in an electrically conductive way. Thereby, a symmetry with respect to the trench is brought about, the sections of the trench each are at the same potential and, with reference to the representations of the SOI-discs and power transistors shown there, which can be located next to each other, see volume 6, paragraph [0022] there, a ring-shaped structure or an octagonal or hexagonal structure and, if applicable, a rectangular structure is mentioned. It would, while being circumferential or along the isolation trenches each, there 4, provide for an equal potential to be applied to each isolation trench. In none of these arrangements, the electrical field extends in parallel to the isolation trench wall but extends starting from the trench wall into the depth direction and concentrically to the centre of the source.

It is a purpose of the invention to provide a MOS transistor which guarantees a voltage as high as possible, has a place requirement as low as possible and allows the integration into integrated smart power circuits. There from, the object of the invention results to form the edge structure of the transistor such that it certainly fulfils the requirements with respect to high breakthrough voltages, achieves a good isolation to the surrounding area and occupies a minimum of space on the silicon disc anyhow.

This object is achieved by the teaching of the claims.

The transistor has the advantages that no additional processing steps for special doping regions or any field plate structures are required for the edge termination. Thereby the large lateral distances which are commonly necessary at high voltages, are dispensed with. Therefore, the complete transistor (with edge structure) can be implemented much smaller. The edge with only the isolation trench serves, at the same time, as isolation structure to neighbouring circuit components on the silicon disc. This is also a big advantage in view of an efficient usage of the surface area. Thereby, a substantial reduction in the required surface space is possible most notably at higher voltages The power transistor is constructed such that it can block a voltage of at least 100V in order to describe its characteristics and, thereby, its configuration. Below this minimum voltage, referred to as a rated voltage, no electrical breakthrough in the blocked state occurs, an electrical breakthrough is, thereby, avoided. The isolation trench is adapted to terminate the circuit component to the outside and to isolate it at the same time with respect to the surroundings and to the circuit components in a SOI disc which are possibly present there.

The isolation trench is narrow and deep in its geometrical shape, it has a many times larger depth as breadth. The isolation trench surrounds the active region of the circuit component completely, wherein its basic shape in view from the above is rectangular, i.e. having two elongated and two shorter sides.

The circuit component is, therein, geometrically adapted such that the high voltage is inhibited or blocked across the longitudinal direction of the circuit component. The arrangement of the source region and the drain region is, therein, arranged near a short side of the elongated rectangular circuit component. Preferably, the source region and/or the drain region has/have substantially an equal distance from three trench walls.

Furthermore, the transistor preferably only has one source region and only one drain region within the circumferential isolation trench.

The MOS power transistor for blocking off voltages above 100V has, in another embodiment, an isolation trench for preventing an early electrical breakthrough in the edge area. An isolation material is provided in it, and it terminates the active region of the power transistor in a circumferential manner. The transistor has an elongated shape with two parallel elongated isolation trench sections and two parallel short isolation trench sections, whereby a drain region is located at the short trench section and a source region is located at the other short trench section, and the regions have substantially the shape of stripes. They have this shape in a top view also in a plain located deeper.

In the blocking state, i.e. in the state of blocking the above mentioned rated voltage, an advantageous characteristic of the field lines in the drift region (in the active region of the MOS power transistor) results thereby. The field lines run in parallel to the long side walls of the trench structure over wide distances there, however, this is only because the drain region lies on a side of the elongated circuit component and the source region lies on the opposite side.

Put in other words, one of the power connections of the MOS power transistor is each near to a shorter trench or wall section of the filled isolation trench. The source region is located near to one short wall, and the drain region is located near the other short wall. The circuit component is, therefore, not symmetric to a transverse plain parallel to the narrower dimension, but very well symmetrical to the longitudinal central plain which runs along the longitudinal direction of the circuit component (parallel to the long sides). Compared to such circuit components which are arranged substantially square or round and which have a central axis as an axis of symmetry, the same potential is not always present at the inside of the isolation trench structure, but, because of the distribution, placing and arrangement of source and drain, a different potential is present, respectively, which results in that the field lines run in the longitudinal direction of the circuit component in parallel to the long wall sections of the isolation trenches.

Preferred embodiments of the depth of the isolation trenches are above 8:1 (depth to breadth), and the breadth is at least 3 µm. At higher isolation voltages up to 400V and 800V which, in this case, also are available as at maximum blockable voltages, higher values up to 15:1 as a ratio of the depth to the breadth of the isolation trench are the result.

Another description of the placing of the power connections drain and source or the drain region and the source region, is labelling them as being strip like. The described geometry allows such a strip like source and drain region. The strip shape may be fitted in a geometrically advantageous way into the active region of a power transistor defined by a rectangular isolation trench.

A geometrically in advantageous round or ring-shaped from of the drain region or the source region is dispensed with. A hexagon or an octagon as a shape is unnecessary at least of the main connection of the transistor located further outwards, or is not comprised by the description of the "strip form", respectively.

Preferred geometric ratios are such that the power transistor is substantially double as long as broad, which is correspondingly true for the trench structure which delimits the power transistor and its active region and terminates it to the outside.

Because of the geometry of the trench which is filled with isolating material, and the rectangular arrangement, 90° corners of the isolation trench are resulting.

The invention is now described with reference to embodiments taking into account the drawings.

Figure 7A:
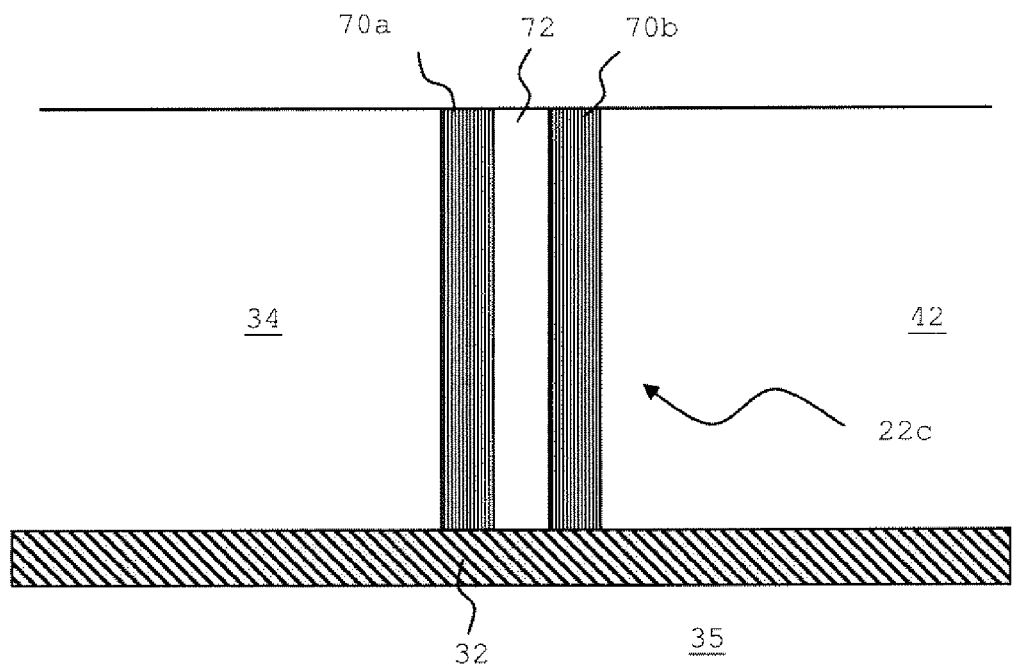
Figure 7B:
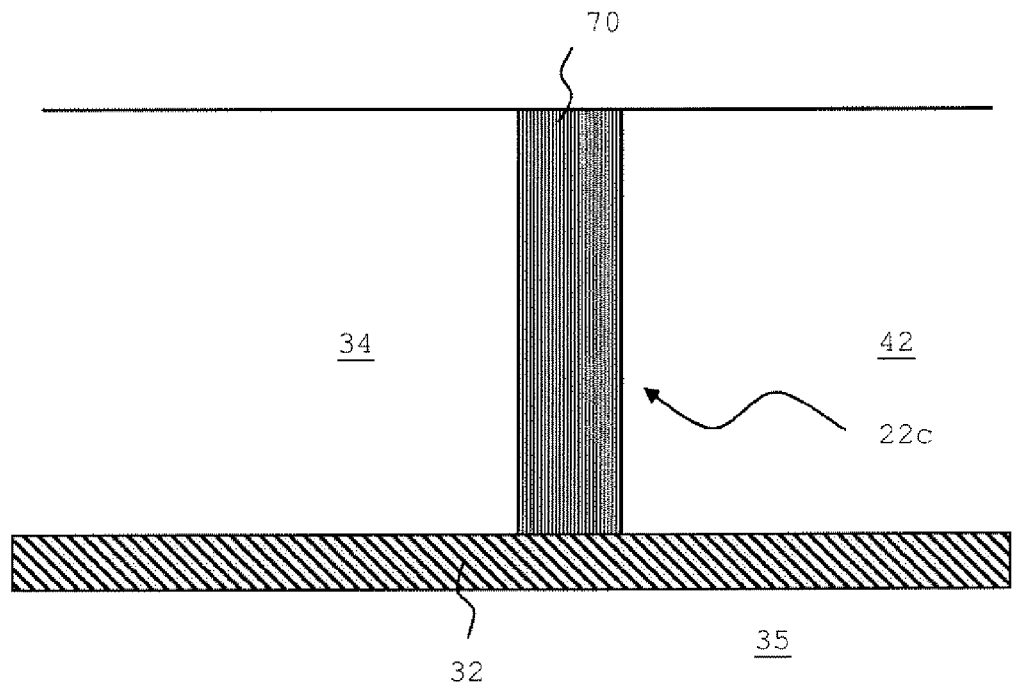

FIG. 7a,

FIG. 7b are examples of the isolation in the isolation trench 22 and along, for example, the trench or isolation wall section 22c, but also for the other sections 22a, 22b, 22d.

Figure 1:
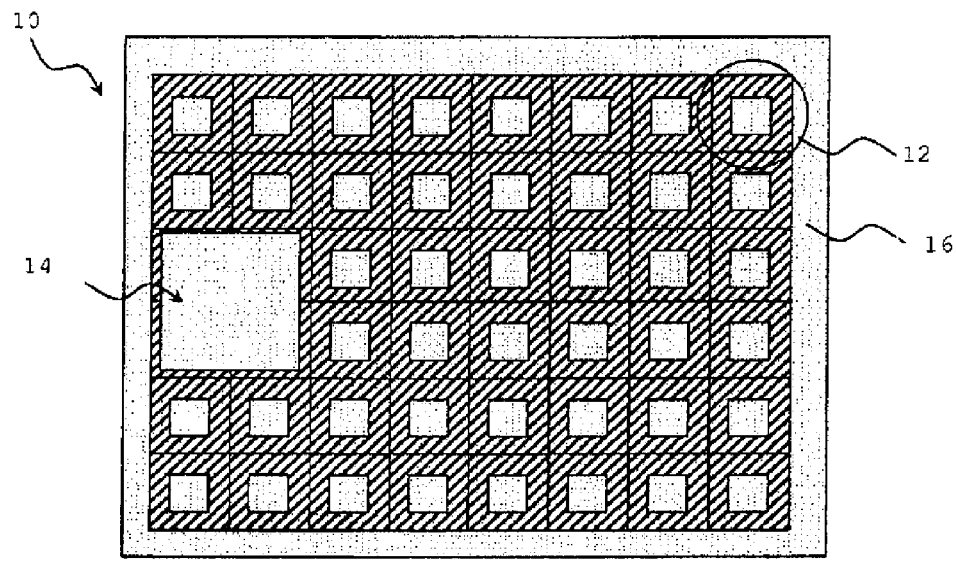
FIG. 1 shows the top view, in a schematic representation, of a MOS power transistor 10 consisting out of several transistor cells and having a edge termination structure surrounding the arrangement, as it is known in the state of the art.
Figure 2:
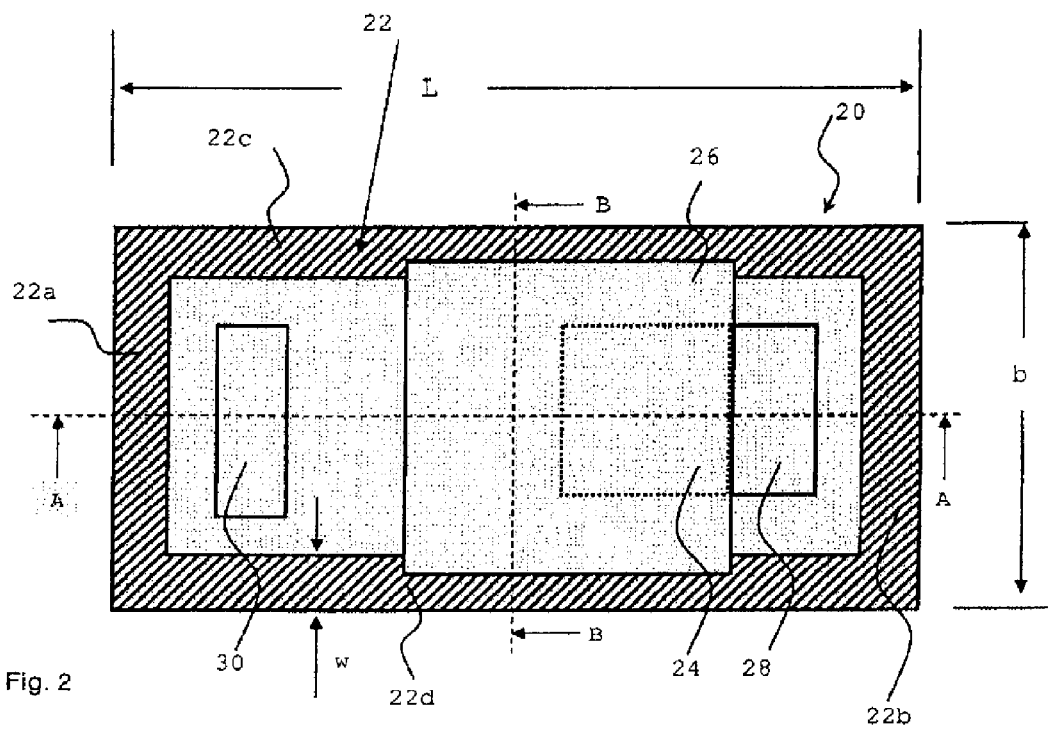
FIG. 2 shows a top view, in a schematic representation, of a single MOS power transistor 20 of the SOI technology having an isolation trench surrounding and terminating the circuit component according to an example of the invention.

The laterally arranged transistor 20 shown in FIG. 2, is made in SOI technology and consists out of the channel region 24, the gate electrode 26, the source- and bulk connection 28 as well as the drain connection 30. It is surrounded on all sides by an isolation trench 22. This isolation trench laterally terminates the socket element.

It consists, in the interior thereof, out of at least one common vertical, dielectric isolation layer 70a and/or 70b, for example out of silicon dioxide, and a filling layer 72, for example, out of poly silicon. Both of this is not shown in detail in the FIGS. 1 to 5, but FIGS. 7a and 7b show possible variations of these isolation arrangements between the active region 34 or 34' and the outer region in the neighbouring region 42 or 42'.

A filling of the trench 22 just by one isolation layer as insulator 70 is possible, as shown in FIG. 7b.

The special feature of the edge of the trench 22 consists in not using further doping regions and field plates which are also not shown.

The minor overlapping of the gate electrode 26 over the isolation trench 22 only serves to compensate fabrication tolerances, for example miss-positioning of the photo masks. This overlapping applies to the longer isolation trench sections 22c, 22d. They have the length L.

In the arrangement shown, the electrical field runs at most of the locations in parallel to the isolation trench 22 at its longitudinal sides 22c, 22d (also longitudinal walls or isolation wall sections).

Figure 3:
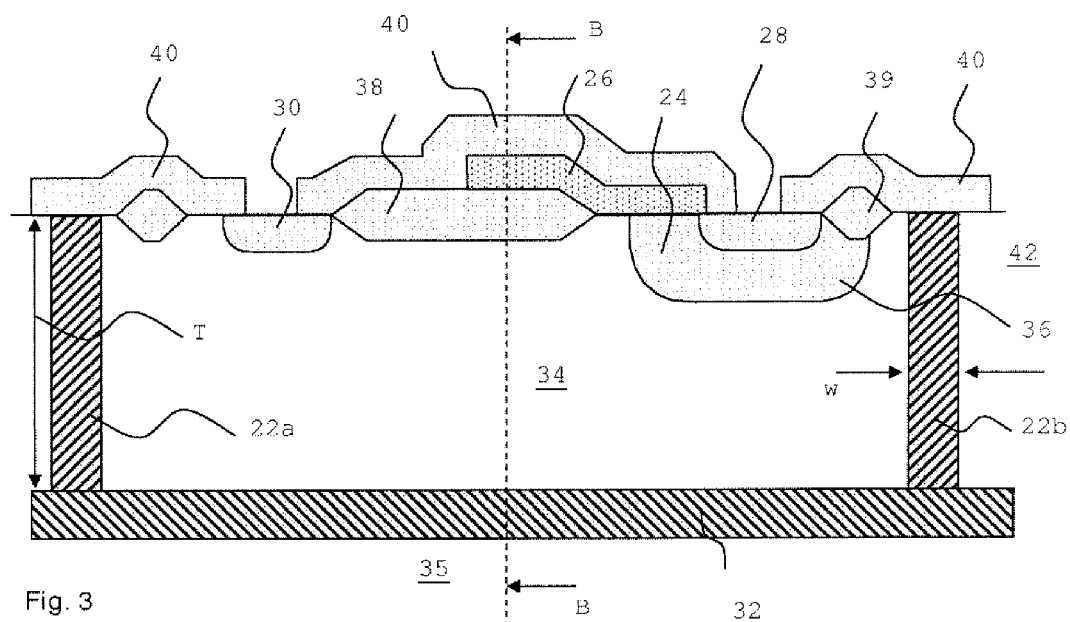
FIG. 3 is a schematic vertical section view through the circuit component shown in FIG. 2, along A-A.
Figure 4:
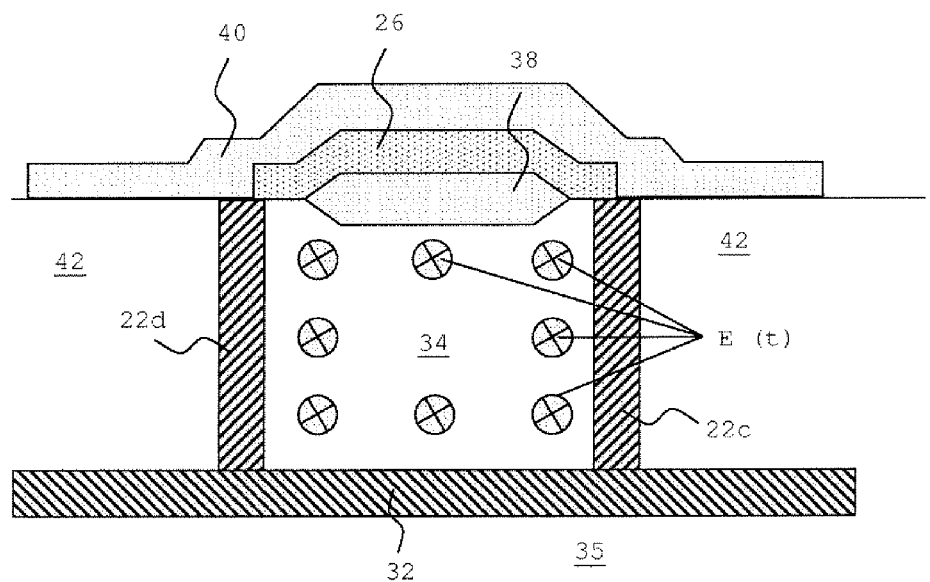
FIG. 4 is the schematic vertical section view through the circuit component shown in FIG. 2, along B-B.
Figure 5:
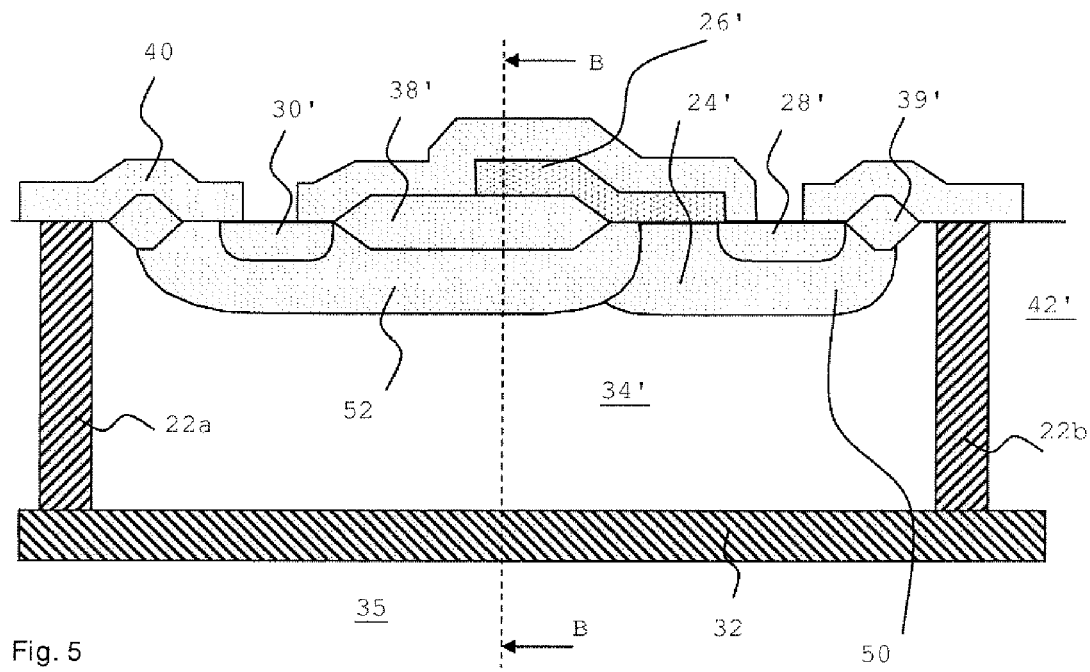
FIG. 5 shows schematically a longitudinal section of an embodiment of a p-channel transistor.
Figure 6:
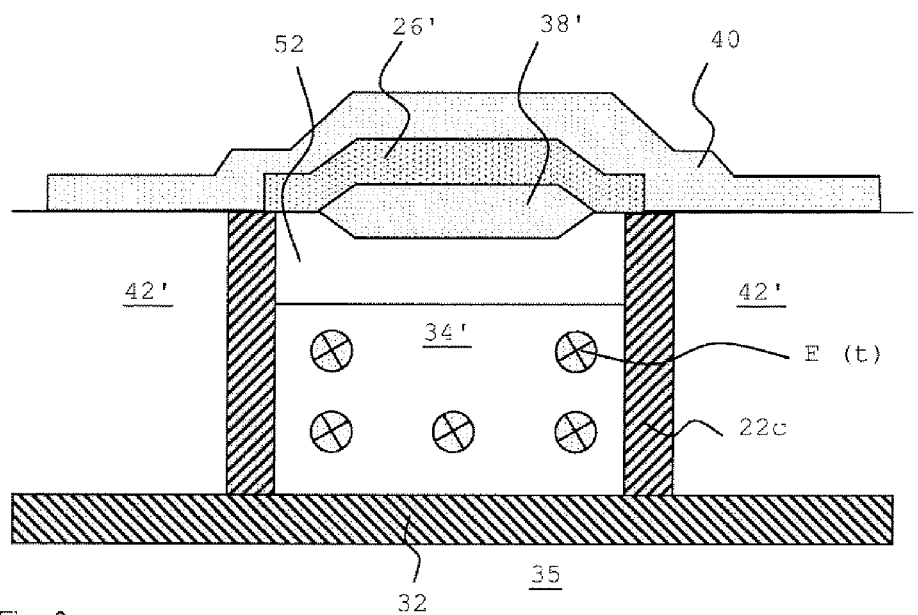
FIG. 6 shows a corresponding traverse section of the transistor of FIG. 5.

In two differing examples, the MOS transistor of FIG. 2 is intended to be explained in FIGS. 3 and 4 as well as FIGS. 5 and 6.

It can be seen in FIG. 3 how the complete Isolation can be achieved by using a SOI (Silicon On Insulator) disc and a circumferential isolation trench. The buried oxide 32 isolates in vertical direction; the isolation trench 22 in lateral direction.

The active substrate 34 has, therein, a first kind of a doping, it is for example n-doped. The n-channel transistor shown in FIG. 3, consists out of a well 36 (for example a p-doped well) on the side of the source and out of the substrate material 34 on the side of the drain. The source region 28 consists, in case of the n-channel transistor, out of a highly doped n-source connection, not shown in detail, and a highly doped p-well connection.

Source 28 and drain 30 have the same kind of doping, respectively, as the substrate 34, and are separated; therein, by a field oxide fillet 38. At the side of the edge, there is a further field oxide fillet 39. The isolation layer 40 isolates the active regions and the gate electrode from metal conductors extending above, which are not shown.

For a p-channel transistor, a complementary change of all the mentioned doping types is possible.

The isolation trench 22 serves as a edge termination structure without further implantation regions and isolates at the same time the transistor in a lateral direction from circuit components in neighbouring regions 42, as is apparent from FIG. 4. The buried layer 32 isolates downwards in vertical direction with respect to the carrier layer 35 of the SOI disc. The field lines E(t) run in parallel to the isolation walls 22c, 22d, as shown (arrows into the plain of the paper), if a blocking or reverse voltage is applied between drain 30 and source 28.

The isolation trench 22 which can be formed according to FIGS. 7a, 7b as a separating wall having longitudinal wall sections 22c, 22d and traverse wall sections 22a, 22b, is clearly shown in the two sectional views of the FIGS. 3 and 4 as reaching into the depth, and by which distances the longitudinal walls and the shorter transverse walls are spaced apart. All of this renders a rectangular arrangement to the transistor 20.

The walls themselves have a substantially greater depth (or height) depending on whether they are interpreted as walls or trenches. They are a multiple times higher than their extension in the breadth. The extension in the breadth w and the extension in the height T can also be stated as a ratio. The ratio is substantially at 8:1 (depth to breadth) for the voltage range above 400V, and it can extend up to 15:1 at higher voltages. A minimum breadth in the order of magnitude between 3 μm and 5 μm makes sense for the above described withstand voltages of the transistors.

This trench defines the outer contour of the transistor 20 in the top view of FIG. 2 with the length L and the breadth b. The measure of L is larger than the measure b. It is apparent, that, in the circumferential direction, the breadth of the trench w remains the same as it is also apparent from the two sections of the FIGS. 3 and 4.

The rectangular basic shape of the transistor allows a strip-like arrangement of the source region and the drain region 28 and 30, respectively. These regions are to be seen in FIG. 2 separately, they are located near a short side of the rectangle, respectively, or at a shorter trench wall. The trench wall 22a is located as a short side of the rectangle next to the strip-like drain region 30. The trench wall 22b is located next to the trench wall 22b which is the opposite short side of the rectangle of the complete edge termination as a circumferential trench 22. It can be taken from FIG. 2 that an embodiment as a transistor has approximately double the length L as compared to the breadth b.

Therein, it is also apparent that the rectangular shape does not have a rotational symmetry to the centre point where the plains A-A and B-B intersect each other. Only one of these plains is a plain of symmetry, namely the plain A-A as longitudinal central plain; to the contrary, the plain perpendicular thereto is no plain of symmetry, which is shown by the different regions 30 and 28 and their respective proximity to the isolation trenches.

With a construction structure and geometry selected in this way, strip-shaped drain region, strip-shaped source region, positioning of these regions near a respective short side of the trench wall and these as opposite short sides of the total arrangement of the MOSFET, and the circumferential trench structure 22 which comprises four corners of 90°, in the blocked state with a blocking voltage, the field lines according to FIG. 4 are obtained which are shown there as arrows as they run through the plain B-B and are perpendicular to the plain of the paper. They extend between the drain region 30 and the source region 28 in the active region 34 in case of a blocking circuit component. The field lines E(t) running in parallel in longitudinal direction of the trench walls 22*c* and 22*d*, are to be seen. On the basis of the larger length of the longitudinal walls, high blocking voltages of the circuit components can be achieved.

The gate electrode 26 which is to be seen in FIG. 4 in the section plain B-B, the field oxide fillet 38 and the isolation cover 40 are also to be seen in FIG. 3 and are explained thereby.

The rectangular shape of the transistor in top view according to FIG. 2 can be given by the length L and the breadth b of the outer dimensions of the isolating trench 22. The ratio of L (length) to b (breadth) is substantially too, but it can also be changed depending on the blocking voltage while keeping the rectangular structure. A larger breadth allows higher currents, a larger length allows higher blocking voltages. In all embodiments, however, the gate region 30 remains strip-shaped and also the source region 28 located opposite thereto remains strip-shaped without being symmetric with respect to the transverse central plain B-B.

FIG. 5 shows the longitudinal section of a first embodiment for making a p-channel transistor. Also in this section, the buried oxide 32 isolates in vertical direction, the isolating trench 22 in lateral direction.

The active substrate 34' has, therein, a first kind of doping, it is for example n-doped. The p-channel transistor shown in FIG. 5, consists out of a well 50 at the side of the source (n-doped well for example) and a well 52 (p-doped for example) on the side of the drain. The source region 28' consists, in the case of a p-channel transistor out of a highly doped p-source connection which is not shown in more detail, and out of a highly doped n-well connection.

Source 28' and drain 30' have opposite kinds of doping, respectively, as the substrate 34' and are, therein, separated by a field oxide fillet 28'. The isolation layer 40 isolates the active regions and the gate electrode 26' from metal conductors arranged on top thereof which are not shown. At the side of the edge, a field oxide fillet 39' is provided which is placed near the upper side of the trench 22.

FIG. 6 shows the section B-B of FIG. 5. The neighbouring regions 42' are insulated by the trench 22 also here without field plates lying on top and without diffused doping regions. The resulting field strength is shown as field lines E(t) running in parallel to the isolating walls 22*c*, 22*d*, and namely in the depth of the active region 34', like in the first example of FIG. 4.

The longitudinal extension and the distances of the trench walls 22*a*, 22*b* (short sides) and 22*c*, 22*d* (longitudinal sides) are such as explained with reference to the previous FIGS. 2, 3 and 4. They relate also to this example. Also the basic geometry of the transistors in a rectangular shape corresponds to the one of the previous embodiments such that, in so far, one can point to the explanations there.

It is again to be referred to the FIGS. 7*a*, 7*b*. There, the trench wall 22*c* corresponds to the longitudinal wall of the FIGS. 4 and 2, it can, however, also correspond to the opposite longitudinal wall 22*a* or also the one of the shorter walls 22*a*, 22*b*. It is an embodiment of the isolation trenches to line them with isolating material and to insert additionally the filling material 72 between the two linings. Another embodiment is the one to insert only one isolating material vertically into the trench which material fills this trench and renders it to be an isolating trench. Also this trench which is formed according to FIG. 7*b*, forms an edge termination in the extension 22 according to FIG. 2. The buried oxide 32 is, as it is described with the preceding Figures, also isolates the substrate layer 35 below the buried oxide.

The adjoining circuit components and the further circuit components of the smart-power-circuit in the regions 42 and 42' to which the one or several shown embodiments of transistors belong or can belong, are not shown in more detail here, but apparent for the man skilled in the art.

As far as not described in detail, the hyphenized elements (for example 38 to 38') of FIGS. 5 and 6 correspond to those in FIGS. 3 and 4.

LIST OF REFERENCE SIGNS

10 Discrete power transistor of the state of the art
12 Single cell having source and gate
14 Gate bond window
16 Edge termination structure in the state of the art
20 Principle sketch of the new transistor structure
22 Isolating trench terminating the active region of the circuit component
24 Channel region
26 Gate (poly silicon)
28 Source and bulk connection
30 Drain connection
32 Buried oxide
34 Active layer of the SOI disc, first kind of doping
35 Carrier layer of the SOI disc
36 Well having a second kind of doping
38 Field oxide, also 38'
39 Field oxide
40 Isolator
42 Neighbouring region, for example of a adjacent transistor
50 Source well of a first kind of doping
52 Drain well of a second kind of doping
70,
70*a*, 70*b* Isolation in the isolating trench
72 Filling layer in the isolating trench

The invention claimed is:

1. A MOS power transistor having a drain and a source separated by a field oxide configured for a rated voltage above 100V between said drain and said source, said MOS power transistor being at least twice as long as it is wide, comprising:
 a rectangular isolating trench in an edge area of the MOS power transistor preventing an electrical breakthrough when blocking the rated voltage, said rectangular isolation trench having two parallel longer trench portions along the length and two parallel shorter trench portions along the width, and defining an outer contour of said MOS power transistor;
 wherein the rectangular isolating trench is filled with an isolating material and a filler material between two vertical layers of the isolating material configuring the rectangular isolating trench to terminate the MOS transistor by electrical field line control to neighboring areas up to the rated voltage;

the MOS power transistor having a gate electrode overlapping with length portions of the two longer trench portions of the rectangular isolation trench, and wherein a ratio of a depth to a breadth of the rectangular isolating trench is between 8:1 and 15:1.

2. The MOS power transistor according to claim 1, further comprising:

an active region; and wherein the rectangular isolating trench in the edge area of the MOS power transistor comprises the isolating material, wherein the rectangular isolating trench terminates the MOS power transistor towards edges thereof, laterally surrounding the active region.

3. The MOS power transistor according to claim 1, wherein said isolating material comprises at least a vertical SiO2 layer.

4. The MOS power transistor according to claim 1, wherein said filler material is a vertical filling layer of poly silicon.

5. The MOS power transistor according to claim 1, wherein the breadth of the isolating trench is substantially equal in a circumferential direction.

6. The MOS power transistor of claim 1, wherein the transistor is implemented in a SOI technology, and further comprises:

a buried oxide layer reaching at least to a circumferential lower end of the rectangular isolating trench;

an active region arranged about the buried oxide layer, the active region being substantially thicker than the buried oxide layer; and a carrier layer located on an opposite side of the buried oxide layer;

wherein, near a first portion of the rectangular isolating trench, the drain is formed as a strip-shaped region, and near a second portion of the rectangular isolating trench, the source is formed as a strip-shaped region, and wherein a gate electrode is formed above the portion of the filler material and thus overlaps a portion of the two longer trench portions of the rectangular isolation trench.

* * * * *